(12) United States Patent
Alvandpour et al.

(10) Patent No.: US 6,493,254 B1
(45) Date of Patent: Dec. 10, 2002

(54) CURRENT LEAKAGE REDUCTION FOR LOADED BIT-LINES IN ON-CHIP MEMORY STRUCTURES

(75) Inventors: Atila Alvandpour, Portland, OR (US); Ram K. Krishnamurthy, Beaverton, OR (US); Siva G. Narendra, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/896,348

(22) Filed: Jun. 28, 2001

(51) Int. Cl.$^7$ ................................ G11C 11/40
(52) U.S. Cl. ....................... 365/154; 365/156
(58) Field of Search ................. 365/154, 156; 257/903, 904

(56) References Cited

U.S. PATENT DOCUMENTS

| | | | | |
|---|---|---|---|---|
| 5,222,039 A | * | 6/1993 | Vinal | 365/156 |
| 5,583,821 A | * | 12/1996 | Rose et al. | 365/226 |
| 5,600,588 A | * | 2/1997 | Kawashima | 365/154 |
| 5,790,452 A | * | 8/1998 | Lien | 365/154 |
| 6,307,805 B1 | * | 10/2001 | Andersen et al. | 365/154 |

* cited by examiner

*Primary Examiner*—Son Mai
(74) *Attorney, Agent, or Firm*—Seth Z. Kalson

(57) ABSTRACT

Embodiments of the present invention relate to memory circuits with heavily loaded bit-lines, and where either the effect of leakage current in the read access or pass transistors is reduced, or leakage current is reduced.

4 Claims, 6 Drawing Sheets

CURRENT LEAKAGE REDUCTION FOR LOADED BIT-LINES IN ON-CHIP MEMORY STRUCTURES

FIELD

Embodiments of the present invention relate to circuits, and more particularly, to memory circuits.

BACKGROUND

As semiconductor process technology provides for smaller and smaller device size, sub-threshold leakage current in MOSFETs (Metal-Oxide-Semiconductor-Field-Effect-Transistor) may increase. Sub-threshold leakage current in a nMOSFET may occur when the gate-to-source voltage of the nMOSFET is less than its threshold voltage, $V_T$. Sub-threshold leakage current may present design challenges for various on-chip memory structures, such as, for example, register files, CAMs (Content-Addressable-Memory), caches, SRAM (Static-Random-Access-Memory), and DRAM (Dynamic-RAM).

Shown in FIG. 1 is a portion of an on-chip SRAM, or cache memory. For simplicity, only four cells are indicated. The content of the stored data is read through complementary bit-lines 102 and 104 by sense amplifier 114. The cells are accessed by bringing one of word lines 106, 108, 110, and 112 HIGH. In the particular embodiment of FIG. 1, word line 106 is HIGH and word lines 108, 110, and 112 are LOW. By bringing word line 106, access nMOSFETs 116 and 118 are turned ON, and the state of memory element 120 may be sensed by sense amplifier 114 via bit-lines 102 and 104. The solid arrows nearby access nMOSFETs 116 and 118 indicate that conduction current flows through access nMOSFETs 116 and 118 to charge or discharge bit lines 102 and 104.

With word lines 108, 110, 112 LOW, access nMOSFETs 121 are OFF because their gate-to-source voltages are less than their threshold voltages. However, there may be sub-threshold leakage current, as indicated by the dashed arrows nearby nMOSFETs 121. In the particular embodiment of FIG. 1, assume that memory element 120 is such that node 122 is HIGH, and memory elements 124 are such that nodes 126 are HIGH. Assume that bit-lines 102 and 104 are pre-charged to HIGH. When memory cell 120 is read, memory cell 120 will keep bit-line 102 HIGH and will bring bit-line 104 from HIGH to LOW. However, there will be contention with the sub-threshold leakage currents through access nMOSFETs 121, which try to charge bit-line 104 and discharge bit-line 102, opposite the effect of the conduction current through access nMOSFETs 116 and 118.

Shown in FIG. 2 is a portion of an on-chip register file. The state stored in memory element 202 is accessed by bringing read select line 204 HIGH so that pass nMOSFET 206 is ON, and keeping the other read select lines LOW. Assume that the state of memory element 202 is such that node 208 is LOW so that pass nMOSFET 210 is OFF. Assume that bit line 212 is pre-charged HIGH. Then, with read select line 204 brought HIGH, bit-line 212 will not be discharged by conduction current. However, there may be sub-threshold leakage current through pass nMOSFET 210 as indicated by the dashed arrow nearby nMOSFET 210. Assume also that nodes 214 are HIGH. Then, with read select lines 216 LOW, there may be sub-threshold leakage current flowing through pass nMOSFETs 218. Consequently, the sub-threshold leakage currents depicted in FIG. 2 will tend to discharge bit-line 212, and may increase the noise margin.

As seen above, sub-threshold leakage current in memory structures may cause undesired voltage level changes in bit-lines, which may lead to incorrect read operations. One approach to mitigating this problem is to partition the bit-lines so as to reduce the number of memory cells connected to any one bit-line. However, this leads to an increase in the number of sense amplifiers, which increases die area and may reduce performance.

DESCRIPTION OF EMBODIMENTS

Figure 1:
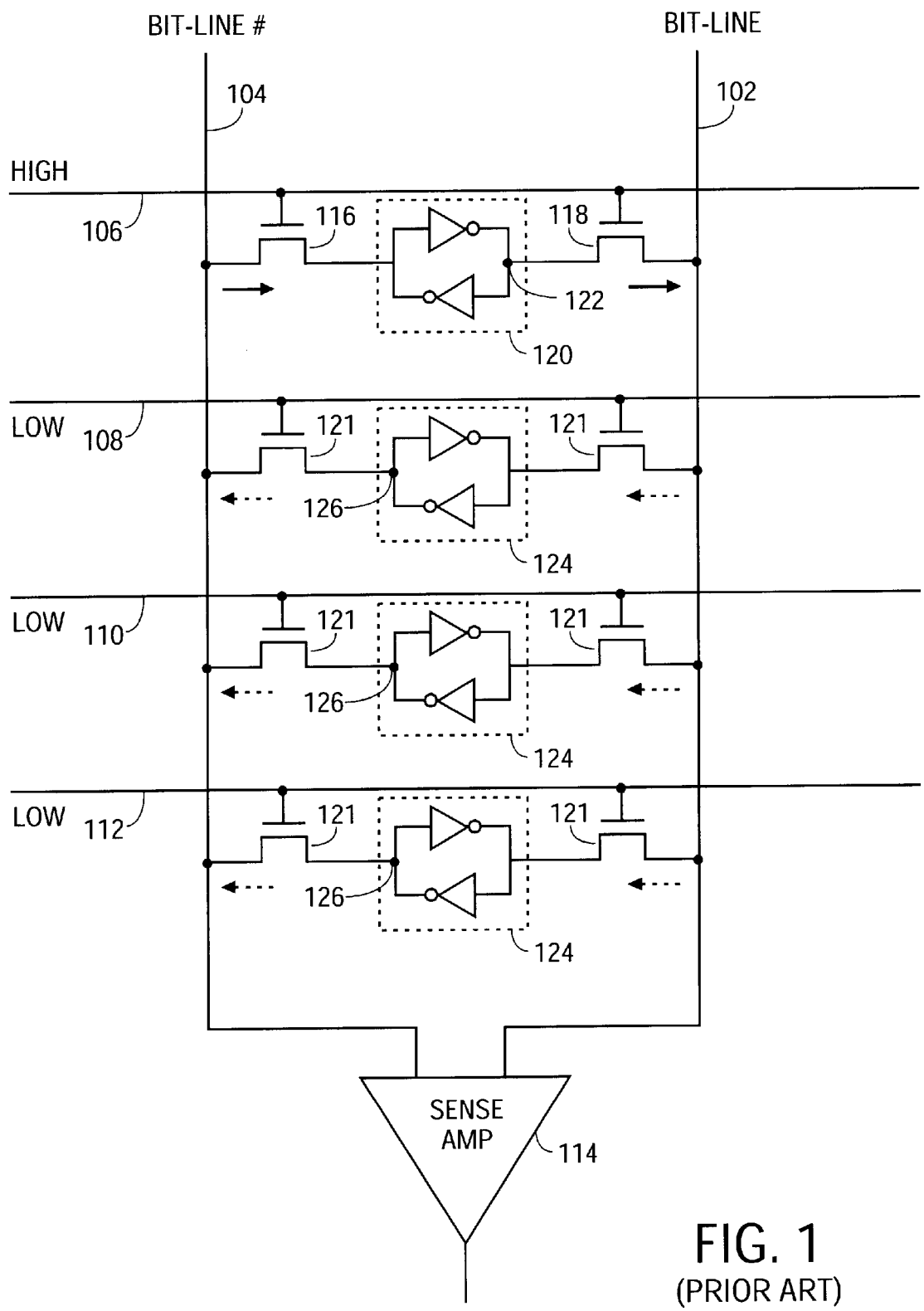
FIG. 1 is a prior art on-chip memory SRAM or cache.
Figure 2:
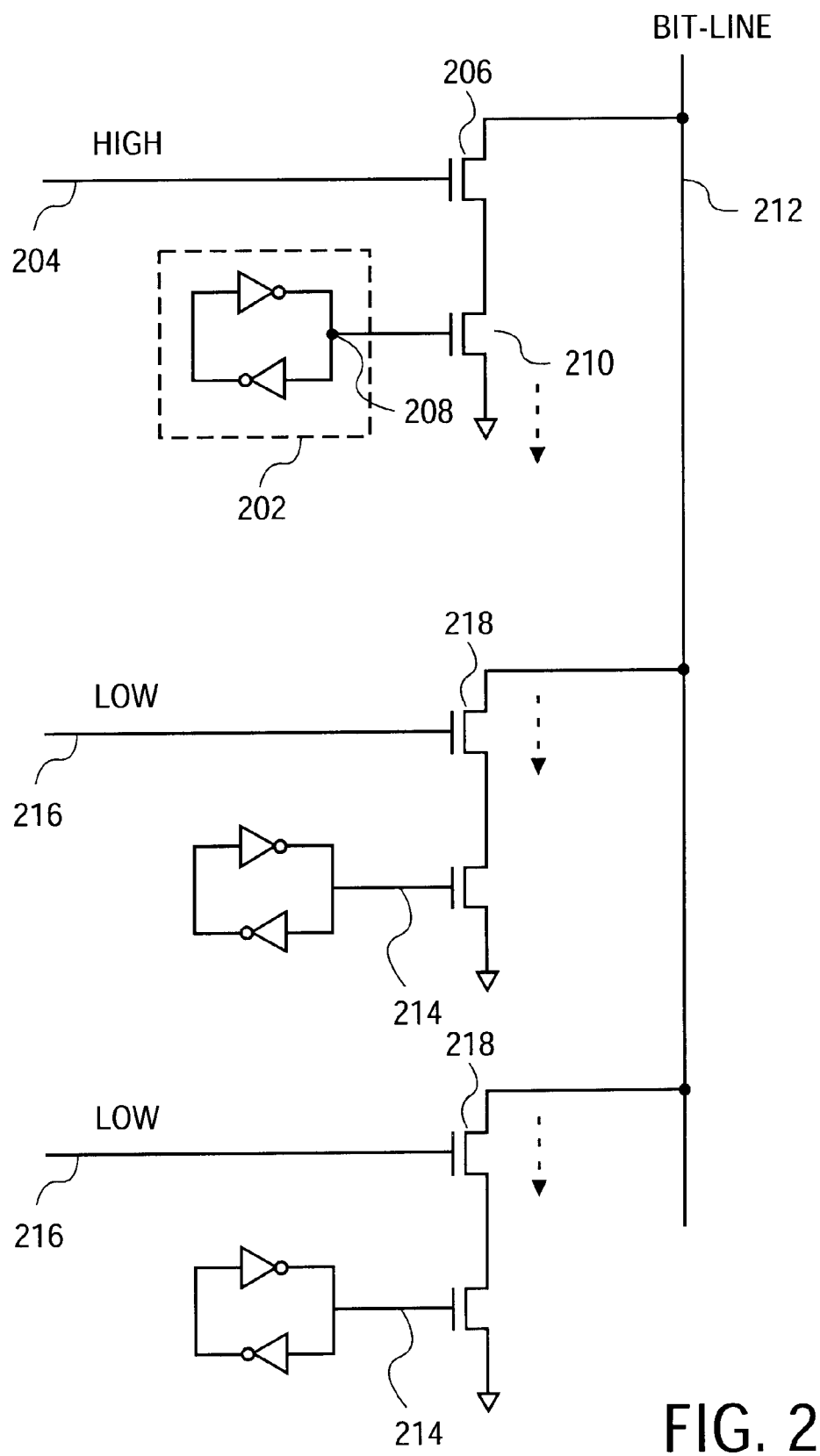
FIG. 2 is a prior art on-chip register file.
Figure 3:
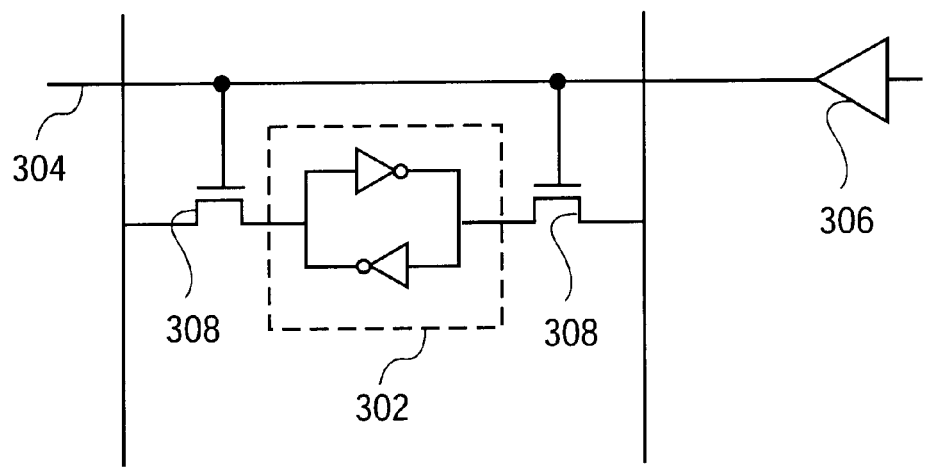
FIG. 3 is an embodiment of the present invention for one memory cell of an on-chip SRAM or cache employing high-$V_T$ access transistors.

A portion of a memory structure, such as an on-chip SRAM or cache, is shown in FIG. 3, where for simplicity one memory cell 302 and one word line 304 are explicitly illustrated. Also shown in FIG. 3 is driver 306 for driving word line 304. Access nMOSFETs 308 are high-$V_T$ (high threshold voltage) nMOSFETs. That is, the threshold voltage for access nMOSFETs 308 is higher than the threshold voltage of other, lower threshold voltage transistors in the memory circuit, such as transistors in memory cell 302, and lower than the supply voltage $V_{cc}$. In some embodiments, the threshold voltage for access nMOSFETs 308 may be 80 mV to 300 mV higher than the other, lower threshold voltage transistors. Or, the threshold voltage for nMOSFETs 308 may be such that its leakage current is substantially less, e.g., ten to one hundred times less, than leakage current in other, lower threshold voltage transistors, such as transistors in memory cell 302.

It is found that using high-$V_T$ access nMOSFETs reduces sub-threshold leakage current. However, high-$V_T$ nrMOS-FETs have lower gain than nMOSFETs with lower threshold voltages. It has generally been believed that scaling up various device features to compensate for lower gain devices would not help to increase the overall circuit performance. However, the authors of these letters patent have found that the topology of memory structures is such that high threshold voltage nMOSFETs may be scaled larger in order to achieve higher performance, and the scaling up of pass or access nMOSFETs does not necessarily affect the performance of read operations. Scaling up the pass or access nMOSFETs increases their gate capacitance, which may be compensated for by increasing the size of the drivers that drive their gates. For example, in the embodiment of FIG. 3, driver 306 is sized larger for high-$V_T$ nMOSFETs 308.

Figure 4:
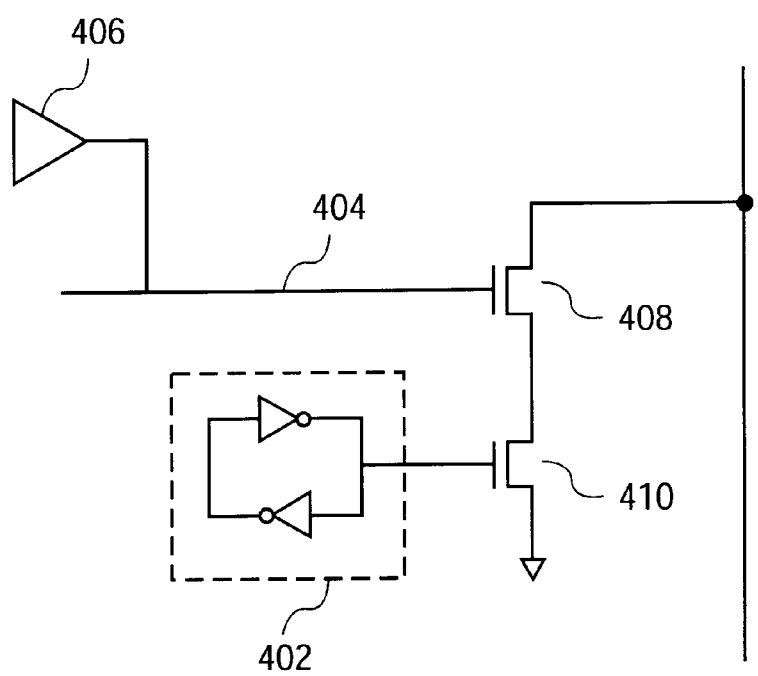
FIG. 4 is an embodiment of the present invention for one memory cell of an on-chip register file employing high-$V_T$ pass transistors.

Another embodiment utilizing high-$V_T$ nMOSFETs and larger sized drivers for an on-chip register file is shown in FIG. 4, where for simplicity only one memory cell 402 and one word line 404 are explicitly illustrated. Also shown in FIG. 4 is driver 406 for driving word line 404. Pass nMOSFET 408 is a high-$V_T$ nMOSFET, and is sized larger to achieve the desired performance. Again, similar to the description of the embodiment of FIG. 3, pass nMOSFET 408 is a high threshold voltage transistor in the sense that its threshold voltage is higher (e.g., 80 mV to 300 mV) than the threshold voltage of other, lower threshold voltage transistors, such as transistors in memory cell 402, or is such that its leakage current is substantially less, e.g., ten to one hundred times less, than the leakage current through other, lower threshold voltage transistors, such as transistors in memory cell 402. Driver 406 is sized larger in order to compensate for the increased gate capacitance of pass nMOSFET 408.

Figure 5:
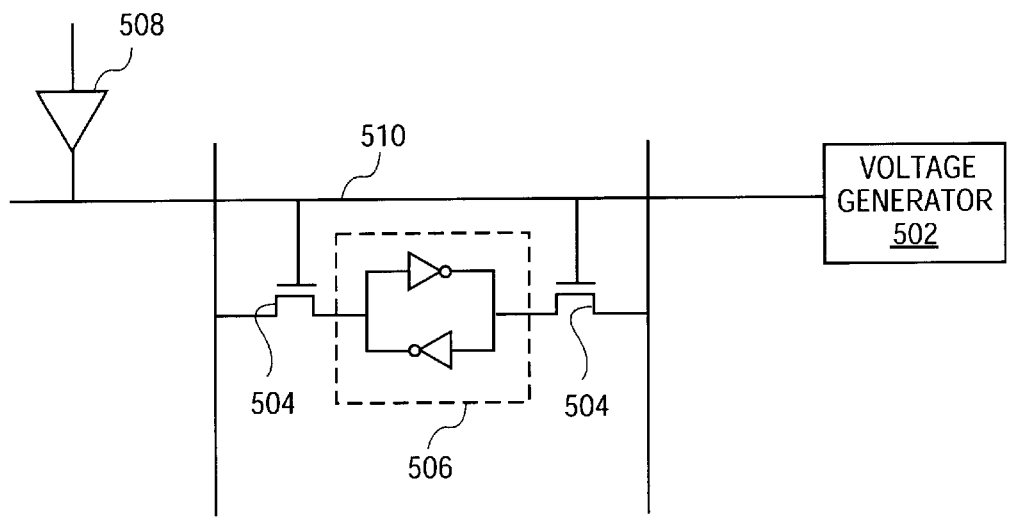
FIG. 5 is another embodiment of the present invention for one memory cell of an on-chip SRAM or cache employing a negative word line voltage. for a no-read operation.

For other embodiments, a negative voltage with respect to ground (substrate) is applied to the gate terminals of access or pass nMOSFETs not performing a read operation. The application of a negative voltage in this manner may significantly reduce leakage current. For example, in FIG. 5, voltage generator provides a negative voltage to the gates of access nMOSFETs 504 when cell 506 is not being read. Voltage generator may be coupled to a memory controller, not shown, or to driver 508 so as to provide a negative voltage when cell 506 is not being read, and to provide an open circuit (very high impedance) to word line 510 when a read operation is being performed. Voltage generator 502 may be combined with driver 508 into a single functional unit.

Figure 6:
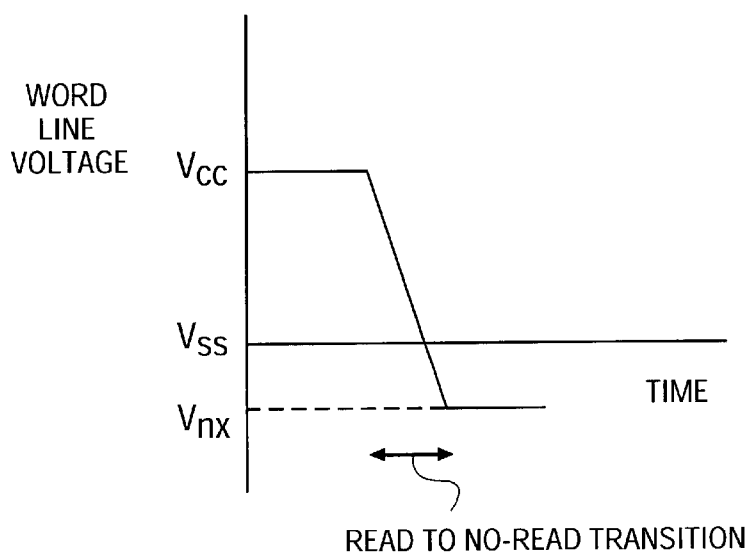
FIG. 6 illustrates the word line voltage of the embodiment of FIG. 5 during a transition from a read operation to a no-read operation.

The voltage transition of word line 510 when transitioning from a read operation to a no-read operation is illustrated in FIG. 6. When in a read operation, the voltage of word line 510 is at $V_{cc}$, whereas when transitioning from a read operation to a no-read operation, the voltage transitions from $V_{cc}$ to negative voltage $V_{nx}$, as illustrated in FIG. 6. It should be appreciated that FIG. 6 is for illustrative purposes only, and the actual shape of the voltage curve may be different.

The use of a negative gate voltage during a no-read operation may lead to higher electric fields over the gate oxide of an access or pass nMOSFET than for the case in which a ground potential is applied to the gate terminals. To help mitigate possible reliability issues due to these higher electric fields, some embodiments may employ thicker gate oxides for the pass or access nMOSFETs than that used for other nMOSFETs or processes.

Figure 7:
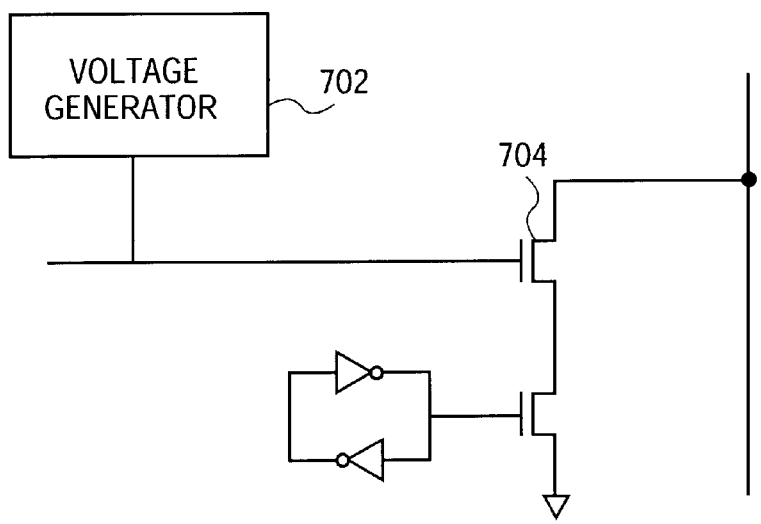
FIG. 7 is an embodiment of the present invention for one memory cell of an on-chip register file employing a negative word line voltage for a no-read operation.

Another embodiment employing negative gate voltages for a cell in an on-chip register file is shown in FIG. 7, where voltage generator 702 provides a negative voltage to the gate of pass nMOSFET 704 during a non-read operation.

Figure 8:
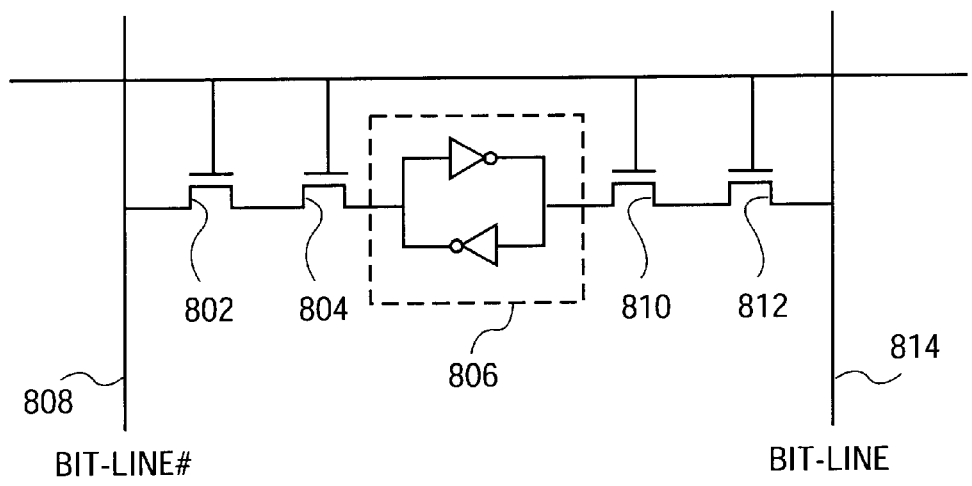
FIG. 8 is an embodiment of the present invention for one memory cell of an on-chip SRAM or cache employing access transistors in a stacked configuration.
Figure 9:
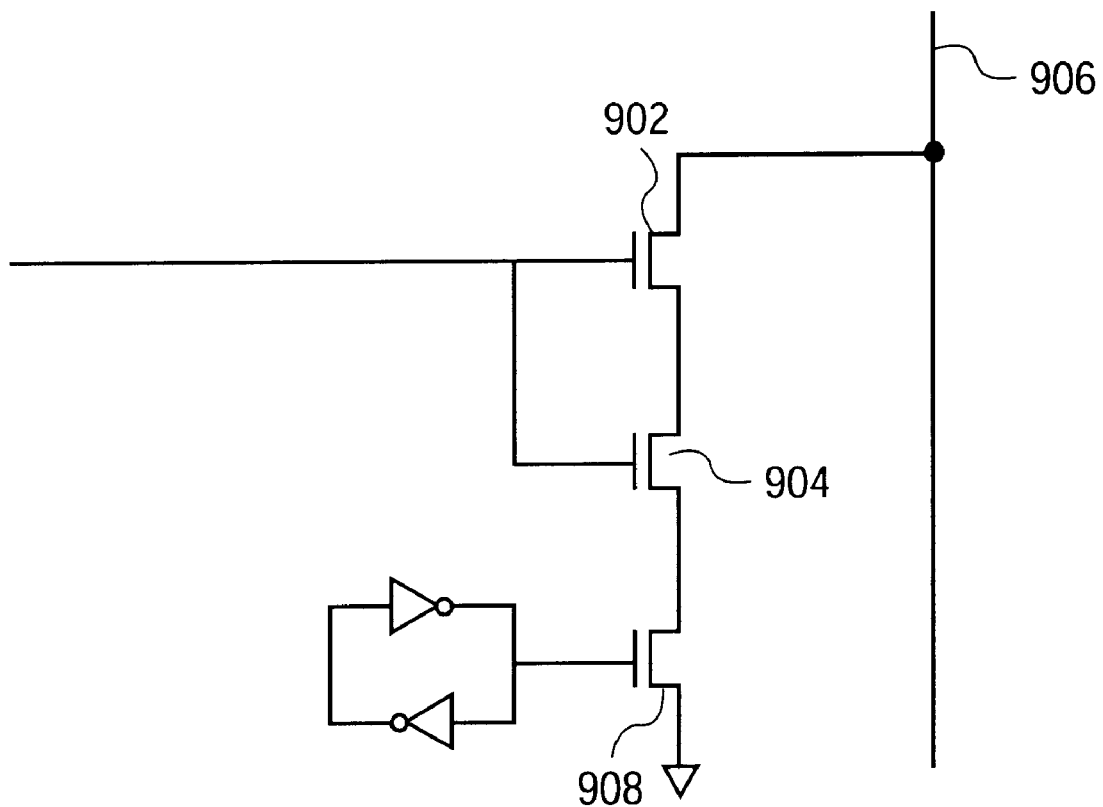
FIG. 9 is an embodiment of the present invention for one memory cell of an on-chip register file employing pass transistors in a stacked configuration.

For other embodiments, use is made of the observation that leakage current through two equally sized nMOSFETs in a stack configuration is significantly less than leakage current through only one nMOSFET not in a stack configuration. Two embodiments making use of this stack effect are shown in FIGS. 8 and 9. In FIG. 8, one cell of an on-chip SRAM or cache is shown. Access nMOSFETs 802 and 804 are in a stack configuration, connected together serially with the source of one nMOSFET connected to the drain of the other nMOSFET. (Which particular terminal of a MOSFET is the source or drain depends upon the direction of conduction current through the MOSFET.) During a read operation, the stack comprising nMOSFETs 802 and 804 couple memory cell 806 to complementary bit-line 808. Similarly, nMOSFETs 810 and 812 are in a stack configuration, coupling memory cell 806 to bit-line 814 during a read operation.

FIG. 9 shows one memory cell of an on-chip register file. Pass nMOSFETs 902 and 904 are in a stack configuration, so as to couple bit-line 906 to the drain of nMOSFET 908 during a read operation.

Stacking nMOSFETs reduces their effective gain. This reduction may be mitigated by increasing the width-to-length ratio of the nMOSFETs.

Described herein are specific embodiments of the present invention. However, many other embodiments may be realized without departing from the scope of the invention as claimed below.

What is claimed is:

1. A memory comprising:

a memory cell to store a unit of information, the memory cell comprising at least he one FET having a threshold voltage; and an access FET coupled to the memory cell to read the unit of information, the access FET having a threshold voltage;

wherein the magnitude of the difference between the threshold voltages of the access FET and the at least one FET is at least 80 mV.

2. A memory comprising:

a memory cell comprising first and second inverters coupled to each other to store one bit of information, the first and second inverters comprising at least one nMOSFET, where each of the at least one nMOSFET has a threshold voltage;

a first bit-line a first access nMOSFET to provide a low impedance path between the memory cell and the first bit-line only if ON, the first access nMOSFET having a threshold voltage;

a second bit-line; and a second access nMOSFET to provide a low impedance path between the memory cell and the second bit-line only if ON so that the second bit-line is complementary to the first bit-line, the second access nMOSFET having a threshold voltage;

wherein each threshold voltage of the first and second access nMOSFETs is greater than each threshold voltage of the at least one nMOSFET by at least 80 mV.

3. A memory comprising:

a memory cell to store a unit of information, the memory cell comprising at least one FET having a threshold voltage; and an access FET coupled to the memory cell to read the unit of information, the access FET having a threshold voltage;

wherein the access FET and the at least one FET have leakage currents, wherein the leakage current of the access FET is at least ten times smaller than the leakage current of the at least one FET.

4. A memory comprising:

a memory cell comprising first and second inverters coupled to each other to store one bit of information, the first and second inverters comprising at least one nMOSFET, where each of the at least one nMOSFET has a threshold voltage;

a first bit-line a first access nMOSFET to provide a low impedance path between the memory cell and the first bit-line only if ON, the first access nMOSFET having a threshold voltage;

a second bit-line; and a second access nMOSFET to provide a low impedance path between the memory cell and the second bit-line only if ON so that the second bit-line is complementary to the first bit-line, the second access nMOSFET having a threshold voltage;

wherein the first access nMOSFET, the second access nMOSFET, and the at least one nMOSFET have leakage currents, wherein the leakage currents of the first and second access nMOSFETs is less than ten times the leakage current of the at least one nMOSFET.

* * * * *